(12) United States Patent
Cox et al.

(10) Patent No.: US 6,904,072 B2
(45) Date of Patent: *Jun. 7, 2005

(54) VERTICAL CAVITY SURFACE EMITTING LASER HAVING A GAIN GUIDE APERTURE INTERIOR TO AN OXIDE CONFINEMENT LAYER

(75) Inventors: James A. Cox, New Brighton, MN (US); Eva Strzelecka, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 375 days.

This patent is subject to a terminal disclaimer.

(21) Appl. No.: 10/028,437

(22) Filed: Dec. 28, 2001

(65) Prior Publication Data

US 2003/0123514 A1 Jul. 3, 2003

(51) Int. Cl.[7] .................................................. H01S 5/00
(52) U.S. Cl. ........................................ 372/46; 372/45
(58) Field of Search .............................. 372/44–47, 96; 392/22, 28, 45–46, 96

(56) References Cited

U.S. PATENT DOCUMENTS

| | | | |
|---|---|---|---|
| 5,262,360 A | 11/1993 | Holonyak, Jr. et al. | 437/237 |
| 5,373,522 A | 12/1994 | Holonyak, Jr. et al. | 372/45 |
| 5,493,577 A | 2/1996 | Choquette et al. | 372/46 |
| 5,567,980 A | 10/1996 | Holonyak, Jr. et al. | 257/63 |
| 5,574,738 A * | 11/1996 | Morgan | 372/28 |
| 5,581,571 A | 12/1996 | Holonyak, Jr. et al. | 372/46 |
| 5,696,023 A | 12/1997 | Holonyak, Jr. et al. | 437/133 |
| 5,729,566 A * | 3/1998 | Jewell | 372/96 |
| 5,882,948 A * | 3/1999 | Jewell | 438/22 |
| 5,896,408 A | 4/1999 | Corzine et al. | 372/46 |
| 5,903,588 A | 5/1999 | Guenter et al. | 372/46 |
| 5,903,589 A | 5/1999 | Jewell | 372/96 |
| 5,978,408 A | 11/1999 | Thornton | 372/96 |
| 6,014,395 A | 1/2000 | Jewell | 372/45 |
| 6,208,681 B1 | 3/2001 | Thornton | 372/96 |
| 6,269,109 B1 | 7/2001 | Jewell | 372/43 |
| 6,297,068 B1 | 10/2001 | Thornton | 438/16 |
| 6,372,533 B2 | 4/2002 | Jayaraman et al. | 438/22 |
| 6,658,040 B1 * | 12/2003 | Hu et al. | 372/96 |
| 2003/0123502 A1 * | 7/2003 | Biard et al. | 372/45 |
| 2003/0138017 A1 * | 7/2003 | Lee et al. | 372/46 |
| 2003/0185267 A1 * | 10/2003 | Hwang et al. | 372/96 |
| 2004/0042518 A1 * | 3/2004 | Tatum et al. | 372/46 |

FOREIGN PATENT DOCUMENTS

| | | |
|---|---|---|
| DE | 201 13 207 U1 | 12/2001 |
| EP | 0 772 266 A1 | 5/1997 |

OTHER PUBLICATIONS

International Search Report, dated Apr. 23, 2003, relative to PCT application No. PCT/US 02/40253, the foreign equivalent to the instant U.S. Appl. No. 10/028,437.

(Continued)

Primary Examiner—Don Wong
Assistant Examiner—Hung Tran Vy
(74) Attorney, Agent, or Firm—Workman Nydegger

(57) ABSTRACT

A VCSEL with current confinement achieved by an oxide insulating region and by an ion implant region. An annular shaped oxide layer is formed, and a gain guide ion implant is formed. The ion implant gain guide includes a central region having high conductivity. The VCSEL further includes first and second mirrors that are separated by an optical path of at least one wavelength. Furthermore, the oxide insulating region beneficially has a optical path of less than ¼ wavelength. The ion implanted spatial region is beneficially concentrically aligned with the oxide insulating region.

13 Claims, 2 Drawing Sheets

OTHER PUBLICATIONS

Chang, C., et al., "Parasitics and design considerations on oxide–implant VCSELs", article Ieee Photonics Technology Letters, vol. 13, No 12, Dec 2001, pp. 1274–1276, XP–001076755.

Bowers, J., et al., "Fused vertical cavity lasers with oxide aperture", final report 1996–1997 for MICRO project 96–042, no month.

Choe, J.S., et al., "Lateral oxidation of AlAs layers at elevated water vapour pressure using a closed–chamber system", letter to the editor, Semicond. Sci. Technol., 15 (2000), pp. L35–L38, no month.

Chua, C.L., et al., "Low–threshold 1.57-$\mu$m VC–SEL's using strain–compensated quantum wells and oxide/metal backmirror", article, IEEE Photonics Technology Letters, vol. 7, No. 5, pp. 444–446, May 1995.

Chua, C.L., et al., "Planar laterally oxidized vertical–cavity lasers for low threshold high–density top–surface–emitting arrays", article, IEEE Photonics Technology Letters, vol. 9, No. 8, pp. 1060–1062, Aug. 1997.

Farrier, R.C. "Parametric control for wafer fabrication: new CIM techniques for data analysis," Solid State Technology, Sep. 1997.

Fushimi, H., and Wada, K, "Degradation Mechanism in Carbon–doped GaAs Minority–carrier Injection Devices," 1966 IEEE International Reliability Physics Proceedings; (1996), pp. 214–220, no month.

Greib, K.M., et al., "Comparison of fabrication approaches for selectively oxidized VCSEL arrays", article, Vertical–Cavity Surface–Emitting Lasers IV, Proceedings of SPIE, vol. 3946, pp. 36–40, 2000, no month.

Guenter, J., et al., "Commercialization of Honeywell's VCSEL Technology: Further Developments," in Vertical–Cavity Surface–Emitting Lasers V, Choquette, K.D. and Lei, C., editors, Proceedings of the SPIE vol. 4286, (2001), pp. 1–14, no month.

Guenter, J., et al., "Reliability of proton–implanted VCSELs for data communications," in Fabrication, Testing, and Reliability of Semiconductor Lasers, Fallahi, M. and Wang, S. editors, Proceedings of the SPIE, vol. 2683, (1996), pp. 102–113, no month.

Hawthorne, R.A., et al., "Reliability Study of 850 nm VCSELs for Data Communications," 1996 IEEE International Reliability Physics Proceedings, 34, (1996), pp. 203–210, no months.

Herrick, R.W., et al., "Highly reliable oxide VCSELs manufactured at HP/Agilent Technologies," in Vertical–Cavity Surface–Emitting Lasers IV, Choquette, K.D. and Lei, C., editors, Proceedings of the SPIE vol. 3946, (2000), pp. 14–19.

Kash, J.A., et al., "Recombination in GaAs at the AlAs oxide–GaAs interface," Appl. Phys. Lett. 67 (14), Oct. 2, 1995; pp 2022–2024.

Koley, B., et al., "Dependence of lateral oxidation rate on thickness of AlAs layer of interest as a current aperture in vertical–cavity surface–emitting laser structures", article, Journal of Applied Physics, vol. 84, No. 1, pp. 600–605, Jul. 1, 1998.

Maeda, K., and Takeuchi, S., "Enhanced Glide of Dislocations in GaAs Single Crystals by Electron Beam Irradiation," Japanese Journal of Applied Physics, vol. 20, No. 3 (1981), pp. L165–L168, no month.

Osinski, M., et al., "Temperature and thickness dependence of steam oxidation of AlAs in cylindrical mesa structures", article, IEEE Photonics Technology Letters, vol. 13, No. 7, pp. 687–689, Jul. 2001.

Peck, D. Stewart, "Comprehensive Model for Humidity Testing Correlation," 1986 IEEE International Reliability Physics Proceedings; (1986), pp. 44–50, no month.

Ries, M.J., et al., "Visible–Spectrum ($\lambda$=650 nm) photopumped (pulsed, 300 K) laser operation of a vertical–cavity AlAs– AlGaAs/lnAlP–lnGaP quantum well heterostructure utilizing native oxide mirrors", article, Appl. Phys. Lett. 67, pp. 1107–1109, Aug. 1995.

Sah, C–T, et al., "Carrier Generation and Recombination in P–N Junctions and P–N Junction Characteristics," Proceedings of the IRE, Sep. 1957, pp 1228–1243.

Shi, S., et al., "Photoluminescence study of hydrogenated aluminum oxide–semiconductor interface," Appl. Phys. Lett. 70 (10), Mar. 10, 1997; pp 1293–1295.

Spicer, W.E., et al., "The Unified Model For Schottky Barrier Formation and MOS Interface States in 3–5 Compounds," Applications of Surface Science, 9 (1981); pp 83–91, no date.

Tao, A., "Wet–oxidation of digitally alloyed AlGaAs", article, National Nanofabrication Users Network, pp. 74–75, no date.

Tatum, J.A., et al., "Commercialization of Honeywell's VCSEL Technology," in Vertical–Cavity Surface–Emitting Lasers IV, Choquette, K.D. and Lei, C., editors, Proceedings of the SPIE vol. 3946, (2000), pp. 2–13, no month.

Wieder, H.H., "Fermi level and surface barrier of $Ga_xIn_{1-x}As$ alloys," Appl. Phys. Lett. 38(3), Feb. 1, 1981; pp 170–171.

Wipiejiewski, T., et al., "VCSELs for datacom applications,", in Vertical–Cavity Surface–Emitting Lasers III, Choquette, K.D. and Lei, C., editors, Proceedings of the SPIE vol. 3627, (1999), pp. 14–22, no month.

Kent D. Choquette et al., "High Single Mode Operation from Hybrid Ion Implanted/Selectively Oxidized VCSELs", 2000 IEEE 17th International Semiconductor Laser Conference, Monterrey, CA, ppgs. 59–60, no month.

G. Ronald Hadley et al., "High–Power Single Mode Operation from Hybrid Ion Implanted/Selectively Oxidized VCSELs", 13th Annual Meeting IEEE Lasers and Electro–Optics Society 2000 Annual Meeting (LEOS 2000), Rio Grande, Puerto Rico, ppgs. 804–805, no months.

* cited by examiner

VERTICAL CAVITY SURFACE EMITTING LASER HAVING A GAIN GUIDE APERTURE INTERIOR TO AN OXIDE CONFINEMENT LAYER

UNITED STATES GOVERNMENT RIGHTS

The United States Government has acquired certain rights in this invention through Government Contract No. 70NANB5H1114 awarded by NIST ATP.

CROSS-REFERENCE TO RELATED APPLICATIONS

Not applicable.

BACKGROUND OF THE INVENTION

1. Field of the Invention

The present invention relates generally to the field of vertical cavity surface emitting lasers. More specifically, it relates to current confinement structures used in vertical cavity surface emitting lasers.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics.

VCSELs include semiconductor active regions, which can be fabricated from a number of material systems, distributed Bragg reflector (DBR) mirrors, current confinement structures, substrates, and contacts. Because of their complicated structure, and because of their material requirements, VCSELs are usually grown using metal-organic chemical vapor deposition (MOCVD) or by molecular beam epitaxy (MBE).

FIG. 1 illustrates a typical VCSEL 10. As shown, an n-doped gallium arsenide (GaAS) substrate 12 has an n-type electrical contact 14. An n-doped lower mirror stack 16 (a DBR) is on the GaAS substrate 12, and an n-type graded-index lower spacer 18 is disposed over the lower mirror stack 16. An active region 20, usually having a number of quantum wells, is formed over the lower spacer 18. A p-type graded-index top spacer 22 is disposed over the active region 20, and a p-type top mirror stack 24 (another DBR) is disposed over the top spacer 22. Over the top mirror stack 24 is a p-type conduction layer 9, a p-type cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonant at a predetermined wavelength (or at a multiple thereof). At least part of the top mirror stack 24 includes an insulating region 40 that provides current confinement. The insulating region 40 is usually formed either by implanting protons into the top mirror stack 24 or by forming an oxide layer. The insulating region 40 defines a conductive annular central opening 42 that forms an electrically conductive path though the insulating region 40.

In operation, an external bias causes an electrical current 21 to flow from the p-type electrical contact 26 toward the n-type electrical contact 14. The insulating region 40 and the conductive central opening 42 confine the current 21 such that the current flows through the conductive central opening 42 and into the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, by providing a p-type substrate 12), different material systems can be used, operational details can be tuned for maximum performance, and additional structures, such as tunnel junctions, can be added.

While generally successful, VCSELs have problems. For example, in some applications it is important for a VCSEL to emit light in the fundamental mode. That is, light with a single unimodal spatial mode (from only one area of the VCSEL) and with a single spectral content. However, prior art insulating regions 40 are less than optimal in producing single mode light. To understand why this is so, the insulation region 40 needs to be understood in more detail.

As noted, the insulating region 40 and the central opening 42 act as a current guide into the active region. Also as noted, the insulating region is usually produced either by implanting protons or by forming an oxide layer. Proton implantation is described by Y. H. Lee et al., Electr. Lett., Vol. 26, No. 11, pp. 710–711 (1990) and by T. E. Sale, Vertical Cavity Surface Emitting Lasers, Research Press Ltd., pp. 117–127 (1995), both of which are incorporated by reference. Oxide layers are taught by D. L. Huffaker et al., Appl Phys. Lett., Vol. 65, No. 1, pp. 97–99 (1994) and by K. D. Choquette et al., Electr. Lett., Vol. 30, No. 24, pp. 2043–2044 (1994), both of which are incorporated by reference.

Ion-implanted VCSELs are typically fabricated using a single energy proton implant in the shape of an annular ring to define a current aperture (multiple implant energies are used to electrically isolate the entire VCSEL). That proton implantation creates structural defects that produce a relatively high resistance annular structure having a conductive core. While the high resistance annular structure effectively steers current through its conductive core and into the active region, ion implantation does not produce significant optical guiding. The result is that ion implantation is effective at steering current into the active region, but ineffective at limiting the optical modes of the laser. Thus, prior art ion implanted VCSELS tended to operate with multiple lasing modes.

In contrast, VCSELs that use oxide current confinement regions benefit from the oxide layer's optical index of refraction, which is about half that before oxidation. This forms an optical guide that tends to provide transverse mode optical confinement. However, because of the distributed nature of the series resistance, oxide VCSELs have the highest P-N junction current density and the highest optical gain at the edge of the cavity. This current distribution encourages the formation of higher order spatial modes, particularly at large bias currents. While the transverse mode optical confinement suppresses undesirable higher order optical modes, in the prior art to obtain single fundamental mode operation an oxide optical current confinement region had to have such a small aperture that light from the VCSEL was severally reduced.

Oxide VCSELs (those that use oxide current confinement) typically include an AlGaAs layer with a high aluminum content (97–98%). Such a high aluminum content structure tends to oxidize much more rapidly than the material layers used to form the rest of the P-type DBR mirror (which is typically 85% Al and 15% Ga). To fabricate the oxide current confinement, reactive ion etching is used to form trenches to the edge of a high Al content layer. Oxidation then forms about a 10 micron deep oxide structure in the high Al content layer, while forming less then a 1 micron deep oxide structure in the adjacent layers. The high Al content layer oxidizes with a complex aluminum oxide that is not only an electrical insulator, but also which occupies about the same space as the layer before oxidation.

Because oxide VCSELs and ion-implanted VCSELs have different characteristics, VCSEL designers have had to chose from among competing features, high output power with higher order spectral modes (oxide VCSELs), or lower output power but with fewer spatial modes (ion implanted VCSEL). Therefore, a new technique of forming VCSELs with the benefits of both ion implanted VCSELs and oxide VCSELs would be beneficial.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention are directed to a new VCSEL that possess benefits of both ion implanted and oxide VCSELs. According to the principles of the present invention, an oxide structure and an interior gain guide ion implant structure are combined to form a VCSEL. The combination of the oxide layer and an interior ion implant gain guide can achieve desirable low order optical modes with low threshold and high efficiency. To support fewer optical modes the oxide layer is formed more than two mirror periods from the active region. Beneficially, the oxide layer has an optical thickness less than ¼ wavelength.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWING

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings.

Figure 1:
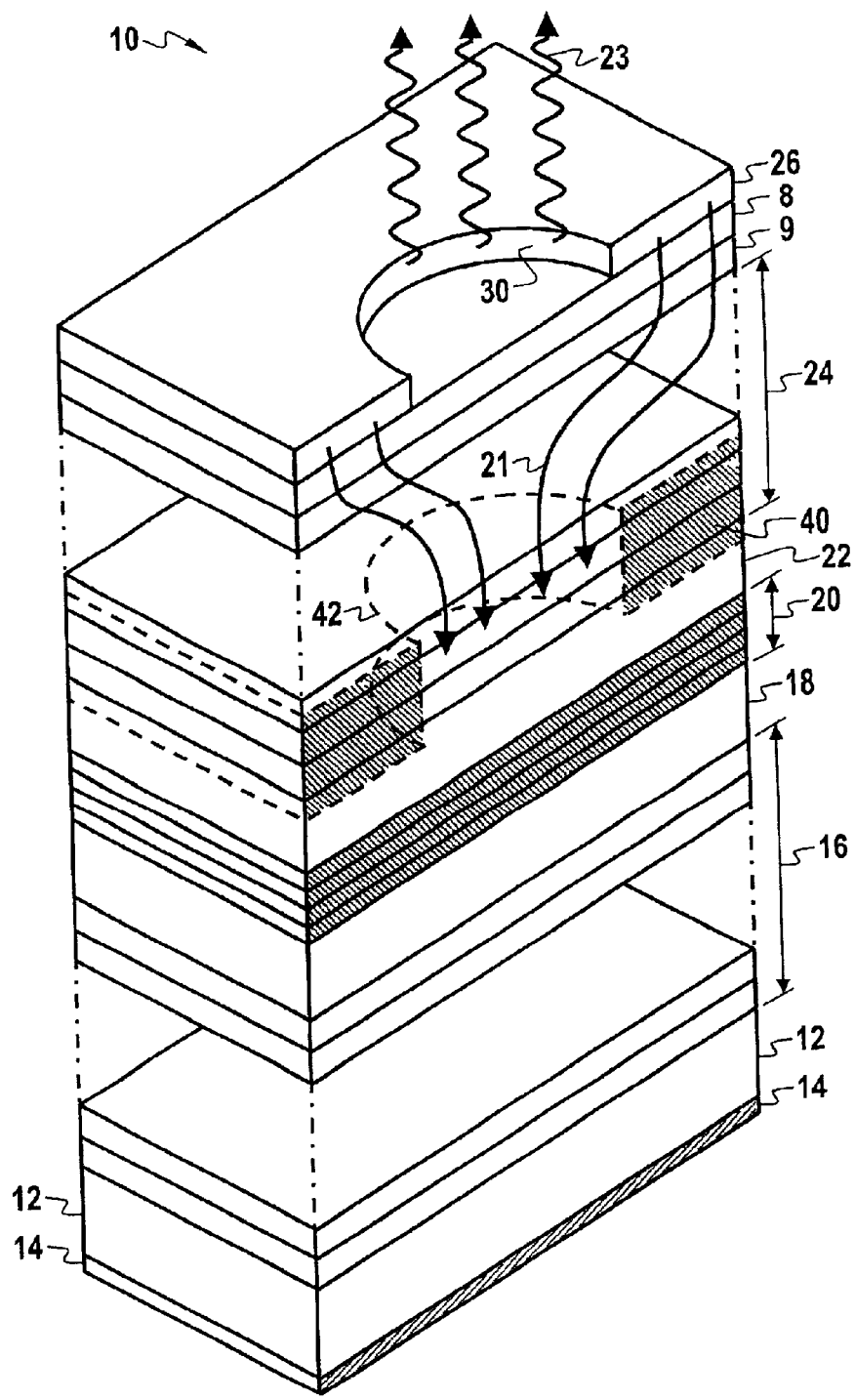
FIG. 1 illustrates a typical vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Figure 2:
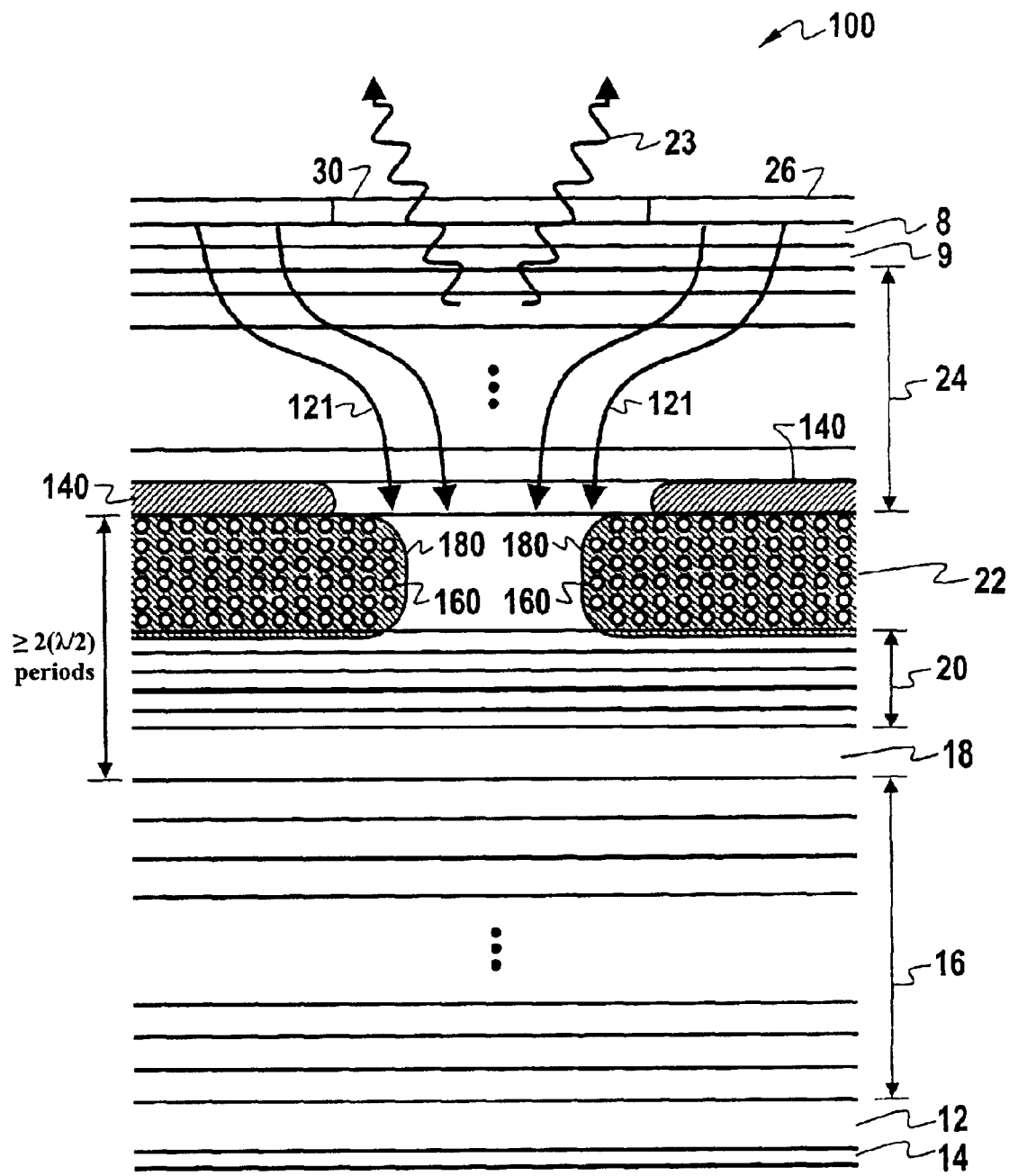
FIG. 2 illustrates a vertical cavity surface emitting laser according to the principles of the present invention.

The principles of the present invention provide for a VCSEL that uses a current confinement structure comprised of an oxide structure and an interior gain guide ion implant structure. An example of such a VCSEL is the VCSEL 100 illustrated in FIG. 2. FIG. 2 should be understood as a "cut-away" schematic depiction of layers of a VCSEL that is generally configured as shown in FIG. 1. Thus, the same element numbers will be used for similar elements in FIG. 2 that were used in FIG 1.

Although for clarity our description of the illustrated embodiment assumes a VCSEL with mirrors and active region based on the AlGaAs material system, the invention broadly applies to VCSELs using any commensurate material system, such as AlGaAs mirrors and AlGaInP/GaAs active region for 670 nm, or AlGaInAs/InP mirrors and AlGaInAs active region for 1550 nm.

As shown in FIG. 2, the VCSEL 100 includes an n-doped gallium arsenide (GaAS) substrate 12 having an n-type electrical contact 14. An n-doped lower mirror stack 16 (a DBR) is on the GaAS substrate 12, and an n-type graded-index lower spacer 18 is disposed over the lower mirror stack 16.

An active region 20 having P-N junction structures and a number of quantum wells is formed over the lower spacer 18. The composition of the active region 20 is beneficially AlGaAs, with the specific aluminum concentration varying in the layers that form the active region 20. For example, one layer may have between twenty and thirty percent of aluminum, while an adjacent layer might have between zero and five percent of aluminum. There could be more or fewer alternating layers, depending on how the quantum wells are to be arranged in the active region 20. Over the active region 20 is a p-type graded-index top spacer 22. A p-type top mirror stack 24 (another DBR) is disposed over the top spacer 22. Over the top mirror stack 24 is a p-type conduction layer 9, a p-type GaAs cap layer 8, and a p-type electrical contact 26. As in the VCSEL 10 (see FIG. 1), the lower spacer 18 and the top spacer 22 separate the lower mirror stack 16 from the top mirror stack 24 such that an optical cavity that is resonant at a specific wavelength is formed. More about this subsequently.

Still referring to FIG. 2, the top mirror stack 24, and part of the top spacer 22, includes an oxide insulating region 140. That oxide insulating region is produced by forming the top mirror stack 24 with an AlGaAs layer having a high aluminum content (97–98%), and then oxidizing that high aluminum content layer along an annular ring. Oxidation then produces the oxide insulating region 140. Then, a spatial region 180 is implanted with ions 160. The implanted ions form a high resistance region within the annular ring formed by the oxide layer 140. The implanted spatial region 180 should be in close proximity to the oxide insulating region 140. For example, the spatial region 180 may be positioned coincident with, somewhat above, or somewhat below the region 140. This enables optimization of the electrical and optical properties for a specific application.

In operation, an external bias causes an electrical current 121 to flow from the p-type electrical contact 26 toward the n-type electrical contact 14. The oxide insulating region 140 and the ion implanted spatial region 180 guide the current 121 through a conductive central opening such that the current 121 flows into the active region 20. Some of the electrons in the current 121 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 2, the light 23 passes through the p-type conduction layer 9, through the p-type GaAs cap layer 8, through an aperture 30 in the p-type electrical contact 26, and out of the surface of the vertical cavity surface emitting laser 100.

Several features of the VCSEL 100 should be highlighted. First, the lower spacer 18 and the top spacer 22 separate the lower mirror stack 16 from the top mirror stack 24 by at least one wavelength in optical path of the light 23. Furthermore, the oxide layer 140 beneficially has an optical path of less than ¼ wavelength. Both of those features reduce the effective index difference, which provides small optical mode confinement, and which tends to suppress higher order optical modes. Also, as shown in FIG. 2, the oxide layer 140 is more than two mirror periods from the active region. Additionally, the ion implanted spatial region 180 is beneficially concentrically aligned with the oxide insulating region 140. The ion implanted spatial region 180 and the oxide insulating region 140 then jointly act to confine electrical current 121 within a small aperture region. Furthermore, the oxide insulating region 140 acts to confine the lasing light along a defined optical path. Thus, optical gain is preferentially given to optical modes having a large fraction of intensity in the small aperture region, and the fundamental mode always satisfies that criterion. Thus, single mode (fundamental) operation can be achieved.

The oxide insulating region 140 is beneficially introduced at the proper location and thickness to achieve the best optical results, while the energy and dose of the implanted ions 60 can be controlled to tailor the lateral sheet resistance. Proper VCSEL design enables achievement of a low order optical mode structure with low threshold and high efficiency.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A vertical cavity surface emitting laser for emitting light having a wavelength, comprising:
   a substrate;
   an active region adjacent said substrate;
   a first mirror between said active region and said substrate; and
   a second minor adjacent said active region, said active region being between said second mirror and said first mirror; and
   an ion implanted spatial region that extends into said active region;
   wherein said second mirror includes an oxide insulating region; and
   wherein said first mirror and said second mirror are separated by an optical path length or least one wavelength.

2. The vertical cavity surface emitting laser of claim 1, wherein said active region has at least one quantum well.

3. The vertical cavity surface emitting laser of claim 1, wherein said oxide insulating region and said ion implanted spatial region confine current flow through a center of said ion implanted spatial region.

4. The vertical cavity surface emitting laser of claim 1, wherein said ion implanted spatial region is concentrically aligned with said oxide insulating region.

5. The vertical cavity surface emitting laser of claim 1, wherein said oxide insulating region has an optical path length of less than ¼ wavelength.

6. A vertical cavity surface emitting laser for emitting light having a wavelength, comprising;
   a substrate;
   an active region adjacent said substrate;
   a first minor between said active region and said substrate; and
   a second mirror adjacent said active region, said active region being between said second mirror and said first mirror, said second mirror including a high aluminum content layer having an aluminum concentration sufficient for oxidizing the second mirror; and
   an ion implanted spatial region that extends into said active region;
   wherein said aluminum content layer is oxidized into an oxide insulating region; and
   wherein said first mirror and said second mirror are separated by an optical path of at least one wavelength.

7. The vertical cavity surface emitting laser of claim 6, further including a first spacer between said first mirror and said active region, and a second spacer between said active region and said second mirror.

8. The vertical cavity surface emitting laser of claim 7, wherein said oxide insulating region extends into said second spacer.

9. The vertical cavity surface emitting laser of claim 6, wherein said substrate is doped with an n-type dopant.

10. The vertical cavity surface emitting laser of claim 6, wherein said active region has at least one quantum well.

11. The vertical cavity surface emitting laser of claim 6, wherein said oxide insulating region and said ion implanted spatial region confine current flow through a center of said ion implanted spatial region.

12. The vertical cavity surface emitting laser of claim 6, wherein said ion implanted spatial region is concentrically aligned with said oxide insulating region.

13. The vertical cavity surface emitting laser of claim 6, wherein said oxide insulating region has an optical path length of less than ¼ wavelength.

* * * * *